United States Patent
Yang et al.

(10) Patent No.: US 7,439,131 B2
(45) Date of Patent: Oct. 21, 2008

(54) FLASH MEMORY DEVICE HAVING RESISTIVITY MEASUREMENT PATTERN AND METHOD OF FORMING THE SAME

(75) Inventors: Ki Hong Yang, Kyeongki-do (KR); Sang Wook Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 392 days.

(21) Appl. No.: 11/164,677

(22) Filed: Dec. 1, 2005

(65) Prior Publication Data

US 2007/0045731 A1 Mar. 1, 2007

(30) Foreign Application Priority Data

Aug. 3, 2005 (KR) .................. 10-2005-0071034

(51) Int. Cl.
*H01L 21/336* (2006.01)
(52) U.S. Cl. .................. 438/257; 438/211; 438/218; 438/221; 438/259; 438/261; 438/264; 438/265; 438/294; 438/296; 438/593; 438/594
(58) Field of Classification Search .................. 438/211, 438/218, 221, 257, 259, 261, 264–265, 294, 438/296, 593–594
See application file for complete search history.

(56) References Cited

U.S. PATENT DOCUMENTS

| 5,488,243 A | 1/1996 | Tsuruta et al. |
| 2005/0009332 A1* | 1/2005 | Lee et al. .................. 438/672 |

FOREIGN PATENT DOCUMENTS

JP 04-164372 6/1992

* cited by examiner

*Primary Examiner*—M. Wilczewski
*Assistant Examiner*—Bac H Au
(74) *Attorney, Agent, or Firm*—Marshall, Gerstein & Borun LLP

(57) ABSTRACT

A flash memory device has a resistivity measurement pattern and method of forming the same. A trench is formed in an isolation film in a Self-Aligned Floating Gate (SAFG) scheme. The trench is buried to form a resistivity measurement floating gate. This allows the resistivity of the floating gate to be measured even in the SAFG scheme. Contacts for resistivity measurement are directly connected to the resistivity measurement floating gate. Therefore, variation in resistivity measurement values, which is incurred by the parasitic interface, can be reduced.

6 Claims, 3 Drawing Sheets

FLASH MEMORY DEVICE HAVING RESISTIVITY MEASUREMENT PATTERN AND METHOD OF FORMING THE SAME

TECHNICAL FIELD

This patent relates to a flash memory device and method of forming the same, and more particularly, to a flash memory device having a resistivity measurement pattern for measuring the resistivity of a floating gate in a Self-Aligned Floating Gate (SAFG) scheme, and method of forming the same.

DISCUSSION OF RELATED ART

A flash memory device is a device manufactured by taking advantages of an EPROM with programming and erase characteristics and an EEPROM with electrical programming and erase characteristics. The flash memory device realizes a one-bit storage state using one transistor and performs electrical program and erase operations.

The flash memory device generally has a structure in which a tunnel oxide film, a floating gate, a dielectric film and a control gate are formed on a silicon substrate. In the flash memory device, data are stored by inserting or extracting electrons into or from the floating gate by applying a proper voltage to the control gate and the silicon substrate.

In the flash memory device, to analyze a breakdown voltage characteristic, a voltage coefficient characteristic and a sheet resistance characteristic or the floating gate, a resistivity measurement pattern is formed in a peripheral region.

FIG. 1 is a cross-sectional view of a flash memory device having a resistivity measurement pattern in the related art.

Referring to FIG. 1, a resistivity measurement contact 16 is not directly connected to a resistivity measurement floating gate 12, but is indirectly connected to the resistivity measurement floating gate 12 through a tungsten film 15 and a control gate polysilicon film 14 on the resistivity measurement floating gate 12.

Reference numeral 10 indicates a semiconductor substrate, 11 indicates an isolation film and 13 indicates an Oxide-Nitride-Oxide (ONO) dielectric film.

In order to measure the resistivity of the floating gate, two resistivity measurement contacts 16 that are electrically connected through the underlying resistivity measurement floating gate 12 are constructed. In this state, the resistivity is measured with both terminals of a resistance measurement device being connected to the two resistivity measurement contacts 16.

The tungsten film 15 and the control gate polysilicon film 14 are disposed between the resistivity measurement contact 16 and the resistivity measurement floating gate 12. The measured resistivity value (Rs) includes a contact resistance value (Rc) of the resistivity measurement contact 16, a unique resistance value (Ppoly1) of the resistivity measurement floating gate 12, and a resistance value in a parasitic interface, i.e., a resistance value in the interface (①) between the tungsten film 15 and the control gate polysilicon film 14 and the interface (②) between the control gate polysilicon film 14 and the resistivity measurement floating gate 12. Severe variation occurs in the measured resistivity value. The reason why variation is severe as described above is the influence by the resistance value in the parasitic interface.

Meanwhile, the resistivity measurement floating gate 12 has to be located on the isolation film 11. If the resistivity measurement floating gate 12 is located on the active region, characteristics of the tunnel oxide film are degraded due to plasma damage, which makes it difficult to evaluate correct device characteristics. There is also a possibility that the active region may be attached if erroneous contact etch is generated.

In the flash memory device, the design rule drops to 70 nm or less and accuracy, which is actually required, becomes low in comparison with the overlay accuracy of a lithography apparatus. Therefore, the SAFG scheme in which the floating gate is formed in an isolation trench that is already formed in a substrate in a self-aligned manner has been adopted.

In the SAFG scheme, the floating gate is automatically formed on the active region. It is thus impossible to form the floating gate on the isolation film. This renders impossible resistivity measurement.

SUMMARY OF THE INVENTION

A flash memory device having a resistivity measurement pattern capable of measuring resistivity may have a stabilized value by minimizing the effect on a parasitic interface resistance. Also described is method of forming such a flash memory device.

The structure of the flash memory device may enable the resistivity of a floating gate to be measured in a SAFG scheme.

A flash memory device having a resistivity measurement pattern may include an isolation film, which is formed in a semiconductor substrate and defines an active region, a resistivity measurement floating gate buried in the isolation film in a trench structure, a control gate pattern formed on a predetermined region of the resistivity measurement floating gate, a dielectric film intervened between the resistivity measurement floating gate and the control gate pattern, and resistivity measurement contacts, which are connected to the resistivity measurement floating gate at both sides of the control gate pattern and are insulated from the control gate pattern.

The control gate pattern may have a stack film of a polysilicon film for a control gate and a tungsten film.

The flash memory device may further have an interlayer insulation film, which insulates the resistivity measurement contacts and the control gate pattern and is formed on the entire surface of the semiconductor substrate.

The flash memory device may further have at least one or more dummy polysilicon films that are buried in the isolation film where the resistivity measurement floating gate is not formed in a trench structure.

The dummy polysilicon films may be formed so that the resistivity measurement floating gate and the dummy polysilicon films are distributed on the entire surface of the isolation film in a uniform density.

The flash memory device may further include a floating gate, which is formed on the semiconductor substrate of the active region and is self-aligned in the isolation film, a tunnel oxide film between the floating gate and the semiconductor substrate, and a control gate formed on the floating gate, wherein the dielectric film extends up to the active region and is intervened between the control gate and the floating gate.

A method of forming a flash memory device having a resistivity measurement pattern may include forming a first trench in a semiconductor substrate on which a screen oxide film and a pad nitride film are stacked and forming an isolation film in the first trench to define an active region, forming a second trench in the isolation film, removing the pad nitride film and the screen oxide film to expose the semiconductor substrate of the active region, forming a tunnel oxide film on the semiconductor substrate of the active region, forming a floating gate on the tunnel oxide film and then forming a resistivity measurement floating gate in the second trench, forming a dielectric film on the entire surface, forming a control gate pattern on a predetermined region of the resistivity measurement floating gate and forming a control gate on the floating gate, forming an interlayer insulation film on the entire surface, and forming resistivity measurement contacts, which are connected to the resistivity measurement floating gate through the interlayer insulation film, at both sides of the control gate pattern.

When the second trench is formed, at least one or more dummy trenches may be formed in the isolation film where the second trench is not formed. When forming the floating gate and the resistivity measurement floating gate, the dummy polysilicon films may be formed in the dummy trench.

The method may further include performing a pre-cleaning process before the dielectric film is formed.

After the tunnel oxide film is formed, a polysilicon film may be deposited. A polishing process may be then performed on the polysilicon film so that the isolation film is exposed, forming the floating gate at a portion from which the pad nitride film is removed and also forming resistivity measurement floating gate in the second trench.

After the dielectric film is formed, a polysilicon film for a control gate and a tungsten film may be sequentially stacked on the dielectric film. The tungsten film and the polysilicon film for the control gates may be then selectively removed so that they remain on the floating gate and a predetermined region of the resistivity measurement floating gate, thereby forming the control gate and the control gate pattern.

The interlayer insulation film having a stack film of first and second interlayer insulation films may be formed by the steps of after forming the control gate and the control gate pattern, forming the first interlayer insulation film on the entire structure, planarizing the first interlayer insulation film so that the control gate and the control gate pattern are exposed, and forming the second interlayer insulation film on the entire structure.

DETAILED DESCRIPTION

Figure 1:
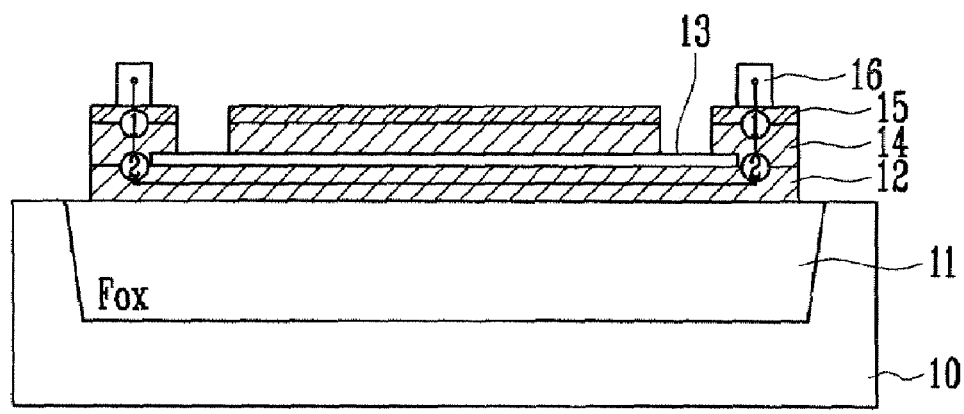
FIG. 1 is a cross-sectional view of a flash memory device having a resistivity measurement pattern in the related art.
Figure 2:
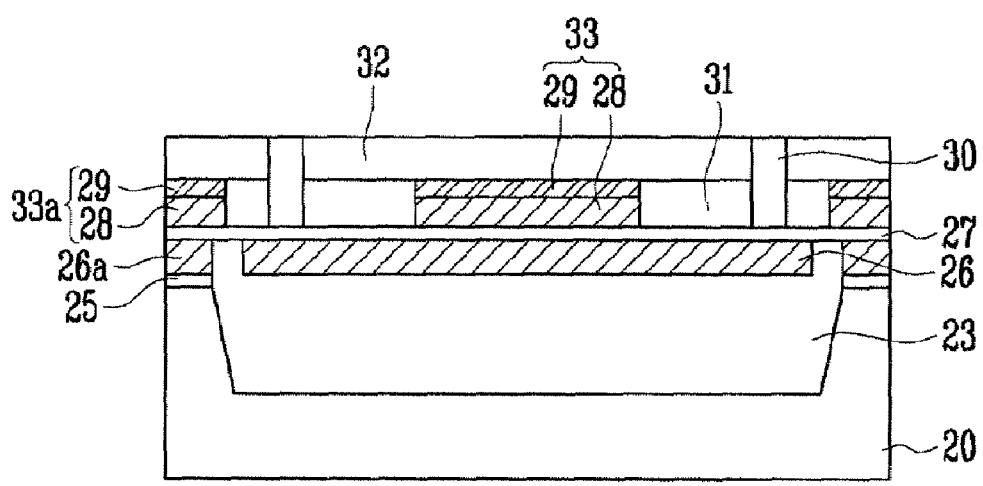
FIG. 2 is a cross-sectional view of a flash memory device having a resistivity measurement pattern according to a herein described embodiment.

FIG. 2 is a cross-sectional view of a flash memory device having a resistivity measurement pattern.

Referring to FIG. 2, a resistivity measurement floating gate 26 of a trench structure is buried in a semiconductor substrate 20 in which an isolation film 23 is formed. To measure the resistivity of a floating gate, two resistivity measurement contacts 30 connected to the outside are directly connected to two resistivity measurement polysilicon films 26.

The isolation film 23 is formed in the semiconductor substrate 20 in a trench structure to define an active region.

Floating gates 26a are self-aligned in the isolation film 23 and are also formed on the semiconductor substrate 20 of the active region with a tunnel oxide film 25 therebetween, thus forming a SAFG structure.

The floating gates 26a and the resistivity measurement floating gates 26 are the same layer formed of a polysilicon film.

Furthermore, control gates 33a are formed on the floating gates 26a. A control gate pattern 33 is formed over the resistivity measurement floating gates 26 between the two resistance measurement contacts 30. A dielectric film 27 of an ONO structure is formed between the floating gates 26a and control gates 33a and between the resistivity measurement floating gates 26 and the control gate pattern 33a. In this case, each of the control gates 33a and the control gate pattern 33 has a stack film of the control gate polysilicon films 28 and the tungsten film 29.

In the present embodiment, it has been described that only the resistivity measurement floating gates 26 are formed in the isolation film 23. To make uniform the density of the polysilicon films within the isolation film 23, additional dummy polysilicon films other than the resistivity measurement floating gates 26 can be formed.

The herein described flash memory device constructed has the self-aligned floating gate structure. Moreover, because the resistivity measurement floating gates can be formed on the isolation film, the resistivity of the floating gates can be measured.

Furthermore, since the resistivity measurement contacts are directly connected to the resistivity measurement polysilicon films, a phenomenon in which variation in a resistivity measurement value increases due to the parasitic interface can be prevented.

A method of forming the flash memory device having the resistivity measurement pattern will be described with reference to FIGS. 3a to 3c.

Figure 3A:
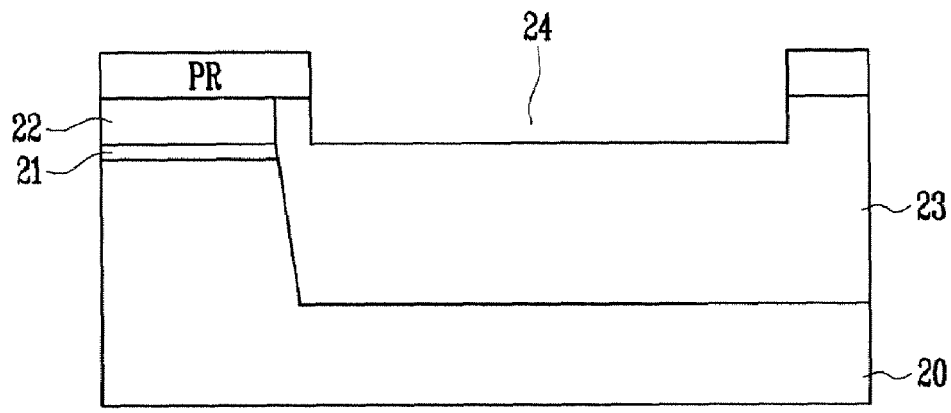
FIGS. 3a to 3c are cross-sectional views of a flash memory device for illustrating a method of manufacturing a flash memory device having a resistivity measurement pattern.
Figure 3B:
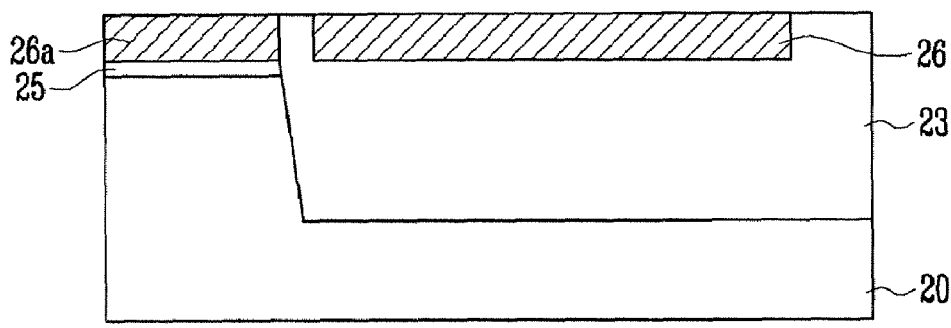
Figure 3C:
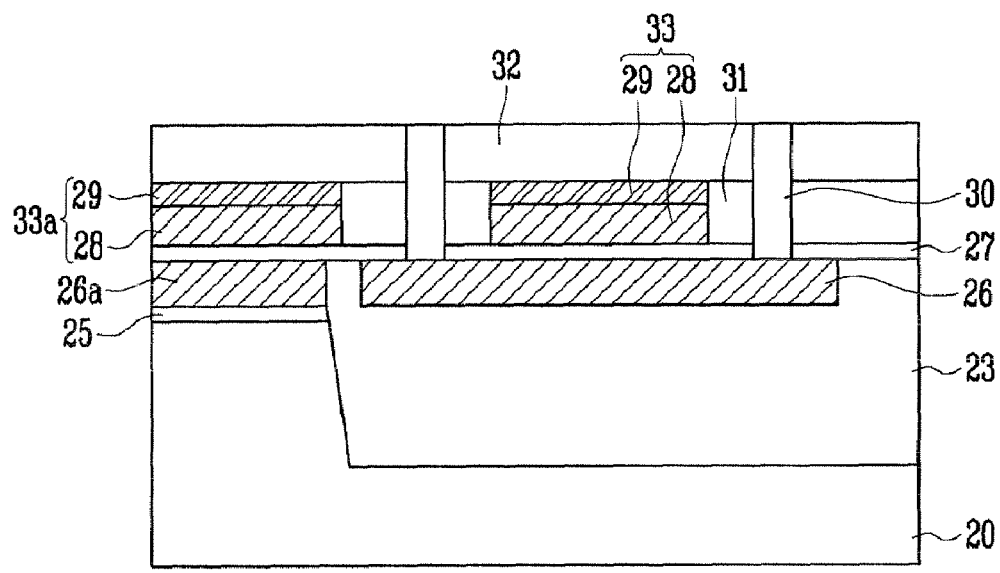

FIGS. 3a to 3c are cross-sectional views for illustrating a method of manufacturing a flash memory device having a resistivity measurement pattern.

Referring to FIG. 3a, a screen oxide film 21 and a pad nitride film 22 are sequentially formed on a semiconductor substrate 20.

The pad nitride film 22 and the screen oxide film 21 are then selectively removed by a photolithography process. The semiconductor substrate 20, which is exposed through the removal of the screen oxide film 21, is etched by a predetermined depth to form a first trench for isolation.

A High Density Plasma (HDP) oxide film is then deposited on the entire surface so that the first trench is completely buried. A polishing process is performed on the entire surface so that the pad nitride film 22 is exposed, forming an isolation film 23 in the first trench. Therefore, an active region is defined.

The polishing process may employ one of an etchback process and a Chemical Mechanical Polishing (CMP) process.

Thereafter, a photoresist PR is coated on the entire surface. The photoresist PR is patterned by an exposure and development process so that a predetermined region of the isolation film 23 is exposed. The isolation film 23 is etched to a predetermined depth using the patterned photoresist PR as a mask, thus forming a second trench 24.

Thereafter, the photoresist PR is removed. As shown in FIG. 3b, the pad nitride film 22 and the screen oxide film 21 are removed to expose the semiconductor substrate 20 of the active region.

Thereafter, a tunnel oxide film 25 is formed on the exposed semiconductor substrate 20 of the active region. A polysilicon film is then deposited on the entire surface. A polishing process is performed on the entire surface to form a floating gate 26a at a portion from which the pad nitride film 22 is removed and also to form a resistivity measurement floating gate 26 in the second trench 24.

To prevent the isolation film 23 from being excessively lost in a pre-cleaning process that is performed before the dielectric film is formed, a dummy polysilicon film, which is insulated from the resistivity measurement floating gate 26, can be formed in the isolation film 23.

In other words, when the second trench 24 is formed, a dummy trench is additionally formed in the isolation film 23. When forming the floating gate 26a and the resistivity measurement polysilicon film 26, a polysilicon film is buried in the dummy trench to form the dummy polysilicon films.

The dummy polysilicon films can have a number and size so that the resistivity measurement floating gate 26 and the dummy polysilicon film can be uniformly distributed on the entire surface of the isolation film 23.

Thereafter, a pre-cleaning process is performed using an oxide film etchant such as HF or BOE. At this time, the isolation film 23 formed of an oxide film is lost through attack. The resistivity measurement floating gate 26 and the dummy polysilicon films can prevent excessive loss of the isolation film 23.

Thereafter, as shown in FIG. 3c, a dielectric film 27 of an ONO structure is deposited on the entire surface. A control gate polysilicon film 28 and a tungsten film 29 are sequentially formed on the dielectric film 27.

The tungsten film 29 and the control gate polysilicon film 28 are selectively removed by a photolithography process so that they remain on the floating gate 26a and a predetermined region of the resistivity measurement floating gate 26, forming a control gate 33a on the floating gate 26a and also forming a control gate pattern 33 on a predetermined region of the resistivity measurement floating gate 26.

Furthermore, a first interlayer insulation film 31 is formed on the entire surface. A polishing process is performed on the first interlayer insulation film 31 so that the tungsten film 29 is exposed. The polishing process may use an etch-back process or a CMP process.

In the case where the resistivity measurement floating gate or the dummy polysilicon film is not formed within the isolation film, the isolation film is lost in the pre-cleaning process performed before the dielectric film is formed. Due to this, a step is generated between isolation regions in which the active region and the isolation film are formed. If the polishing process is performed on the first interlayer insulation film using the tungsten film as a target, the active region is more attacked than the isolation region. Therefore, a problem may arise because the tungsten film 29 formed in the active region is excessively etched.

The resistivity measurement floating gate 26 and the dummy polysilicon films may be formed in the isolation film 23 in order to fundamentally prevent the tungsten film 29 formed in the active region form being excessively etched in the polishing process of the first interlayer insulation film 31.

Thereafter, a second interlayer insulation film 32 is formed on the entire surface. The second and first interlayer insulation films 32, 31 and the dielectric film 27 are selectively etched to form two contacts holes through which the resistivity measurement floating gate 26 at both sides of the control gate pattern 33 is exposed. The contacts holes are buried with a conductive material to form resistivity measurement contacts 30.

Fabrication of the flash memory device having the resistivity measurement pattern is thereby completed.

Figure 4:
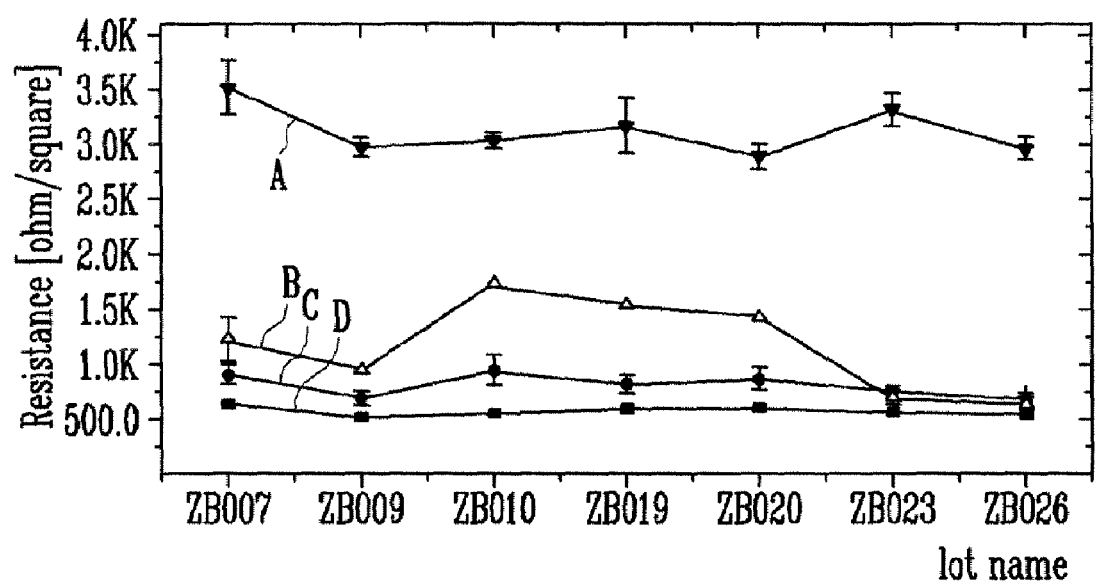
FIG. 4 is a graph for comparing resistance values measured using the resistivity measurement pattern in the related art and according to the present invention.

FIG. 4 is a graph for comparing resistance values measured using the resistivity measurement pattern in the related art and according to the present invention. In FIGS. 4, A and B indicate resistivity values measured using the resistivity measurement pattern in the related art, and C and D indicate resistivity values measured using the resistivity measurement pattern of the present invention.

From FIG. 4, it can be seen that the resistivity values measured using the resistivity measurement pattern in the related art have a wide variation width, whereas the resistivity values measured using the resistivity measurement pattern of the present invention have a narrow variation width and thus have a stable value.

A flash memory device in accordance with one or more of the herein described embodiments may have the following advantages.

Contacts for measuring the resistivity of a floating gate are directly connected to a resistivity measurement floating gate. Therefore, variation in resistivity measurement values, which is incurred by the parasitic interface, can be reduced and stable resistivity values can be measured accordingly.

A resistivity measurement floating gate can be formed on an isolation film in a SAFG scheme. Therefore, the resistivity of the floating gate can also be measured even in the SAFG scheme.

The density of a polysilicon film in the isolation film can be made uniform through the formation of dummy polysilicon films. It is thus possible to prevent the isolation film from being excessively etched in a pre-cleaning process that is performed before a dielectric film is formed. Generation of a step between the active region and the isolation region can be prevented. Therefore, a problem in which a control gate formed on the active region is attacked in a polishing process of an interlayer insulation film can be prevented.

Although the foregoing description has been made with reference to various embodiments, it is to be understood that changes and modifications may be made by the ordinary skilled in the art without departing from the spirit and scope of the present invention defined by the appended claims.

What is claimed as new and desired to be protected by Letters Patent of the United States is:

1. A method of forming a flash memory device having a resistivity measurement pattern, the method comprising:

forming a first trench in a semiconductor substrate on which a screen oxide film and a pad nitride film are stacked and forming an isolation film in the first trench to define an active region;

forming a second trench in the isolation film;

removing the pad nitride film and the screen oxide film to expose the semiconductor substrate of the active region;

forming a tunnel oxide film on the semiconductor substrate of the active region, forming a floating gate on the tunnel oxide film and then forming a resistivity measurement floating gate in the second trench;

forming a dielectric film on the entire surface;

forming a control gate pattern on a predetermined region of the resistivity measurement floating gate and forming a control gate on the floating gate;

forming an interlayer insulation film on the entire surface; and forming resistivity measurement contacts, which are connected to the resistivity measurement floating gate through the interlayer insulation film, at both sides of the control gate pattern.

2. The method as set forth in claim 1, wherein when the second trench is formed, at least one or more dummy trenches are formed in the isolation film where the second trench is not formed, and when forming the floating gate and the resistivity measurement floating gate, the dummy polysilicon films are formed in the dummy trench.

3. The method as set forth in claim 1, further comprising performing a pre-cleaning process before the dielectric film is formed.

4. The method as set forth in claim 1, wherein after the tunnel oxide film is formed, a polysilicon film is deposited, and a polishing process is performed on the polysilicon film so that the isolation film is exposed, forming the floating gate at a portion from which the pad nitride film is removed and forming resistivity measurement floating gate in the second trench.

5. The method as set forth in claim 1, wherein after the dielectric film is formed, a polysilicon film for a control gate and a tungsten film are sequentially stacked on the dielectric film, and the tungsten film and the polysilicon film for the control gates are selectively removed so that they remain on the floating gate and a predetermined region of the resistivity measurement floating gate, thus forming the control gate and the control gate pattern.

6. The method as set forth in claim 1, wherein the interlayer insulation film having a stack film of first and second interlayer insulation films is formed by:
   after forming the control gate and the control gate pattern, forming the first interlayer insulation film on the entire structure;
   planarizing the first interlayer insulation film so that the control gate and the control gate pattern are exposed; and
   forming the second interlayer insulation film on the entire structure.

* * * * *